(12) United States Patent  
Bell et al.

(10) Patent No.: US 9,318,498 B2  
(45) Date of Patent: Apr. 19, 2016

(54) BURIED HARD MASK FOR EMBEDDED SEMICONDUCTOR DEVICE PATTERNING

(71) Applicant: Cypress Semiconductor Corporation, San Jose, CA (US)

(72) Inventors: Scott A. Bell, San Jose, CA (US); Angela Tai Hui, Fremont, CA (US); Simon S. Chan, Saratoga, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 287 days.

(21) Appl. No.: 13/735,156

(22) Filed: Jan. 7, 2013

(65) Prior Publication Data

US 2014/0193972 A1    Jul. 10, 2014

(51) Int. Cl.
| | |
|---|---|
| *H01L 21/3205* | (2006.01) |
| *H01L 27/115* | (2006.01) |
| *H01L 21/8238* | (2006.01) |
| *H01L 21/3213* | (2006.01) |

(52) U.S. Cl.
CPC .. *H01L 27/11546* (2013.01); *H01L 21/823828* (2013.01); *H01L 21/823857* (2013.01); *H01L 21/32139* (2013.01)

(58) Field of Classification Search
USPC .......................................... 438/587, 588, 618
See application file for complete search history.

(56) References Cited

U.S. PATENT DOCUMENTS

| 6,780,708 B1 | 8/2004 | Kinoshita et al. |
| 7,202,174 B1 | 4/2007 | Jung et al. |
| 2006/0240361 A1* | 10/2006 | Lee et al. ...................... 430/313 |
| 2008/0254607 A1 | 10/2008 | Plat et al. |
| 2009/0170318 A1 | 7/2009 | Choi |
| 2011/0183505 A1* | 7/2011 | Min et al. ...................... 438/586 |
| 2012/0025295 A1 | 2/2012 | Sakagami |

FOREIGN PATENT DOCUMENTS

KR    10-0672123 B1    1/2007

OTHER PUBLICATIONS

International Search Report and Written Opinion of the International Searching Authority for International Application No. PCT/US2014/010301, mailed Apr. 30, 2014.

* cited by examiner

*Primary Examiner* — Karen Kusumakar

(57) ABSTRACT

Methods and apparatus for manufacturing semiconductor devices, and such semiconductor devices, are described. According to various aspects of the disclosure, a semiconductor device can be manufactured by forming a core region of the semiconductor device and forming a periphery region of the semiconductor device. A first polysilicon region can then be formed over the core and periphery regions of the semiconductor device. A first mask is formed on the first poly silicon layer and a second polysilicon layer is disposed such that the second polysilicon layer covers the first mask. A second mask can then be formed on the second polysilicon layer. After forming the second mask, portions of the first and second polysilicon layers that are uncovered by either the first or second masks are removed.

20 Claims, 12 Drawing Sheets

BURIED HARD MASK FOR EMBEDDED SEMICONDUCTOR DEVICE PATTERNING

BACKGROUND

1. Technical Field

This disclosure relates generally to improved embedded semiconductor products and methods and apparatus for making such semiconductor products.

2. Related Art

An embedded semiconductor device such as a Flash memory may include, among other things, a memory core and a number of logic gates to control operations that act upon the memory core (e.g., read, write, and erase operations). Combining the memory core and the logic gates of a Flash memory into a single integrated circuit (IC) has historically required relatively expensive, time consuming, and difficult manufacturing processes.

The difficulty in combining the memory core and the logic gates in a single IC stems, at least in part, from the fact that the memory components require different dimensions from the logical gate component. Typically, to achieve the different dimensions, the manufacture of a memory core employs different manufacturing steps than the manufacturing of the logic gates. For instance, the memory core of a Flash memory includes a number of wordlines (WL) that are relatively wide, but spaced very closely together—WLs can be separated by a gap that is smaller than the resolution limit of lithography in some cases. To achieve this small gap between WLs, Flash memory production methods may require the use of a spacer, which is generally not used during the production of other semiconductor components. By contrast, logic gates are preferably thinner, narrower, and spaced further apart than the WL structures better suited for the memory core. To achieve the required dimensions for logical gate structures, a trim process is frequently employed during the manufacturing process. The trim and spacer processes used in the manufacture of the logic gates and the memory, respectively, cannot be performed simultaneously and must, therefore, be performed sequentially in most applications.

Since the use of a spacer and the trim method are largely incompatible with one another, Flash memory producers have had to use separate patterning processes for the memory core and logical gate portions of a Flash memory IC. That is, current methods might pattern the core wordlines using, for instance, a standard mask/etch/mask/etch sequence with a spacer used to define the core and then subsequently pattern the logic using a mask trim. This sequential patterning of the core and logic adds to the time, expense, and difficulty of manufacturing embedded semiconductors such as Flash memory ICs. Accordingly, there is a need for methods and apparatus that facilitate simultaneous manufacturing of semiconductors, such as, but not limited to, Flash memory, that comprise components that are generally subject to different manufacturing process steps.

BRIEF SUMMARY OF THE INVENTION

According to an embodiment, a semiconductor device can be manufactured by forming a core region of the semiconductor device and forming a periphery region of the semiconductor device. A first polysilicon region can then be formed over the core and periphery regions of the semiconductor device. According to aspects of the invention, a first mask is formed on the first polysilicon layer and a second polysilicon layer is disposed such that the second polysilicon layer covers the first mask. A second mask can then be formed on the second polysilicon layer. After forming the second mask, portions of the first and second polysilicon layers that are uncovered by either the first or second masks are removed.

According to some embodiments of the invention, an apparatus is provided. The apparatus may include a semiconductor fabrication module and a controller for the semiconductor fabrication module. The controller may be configured to cause the fabrication module to form core and periphery regions of the semiconductor device and dispose a first polysilicon layer on the semiconductor device. Additionally, the controller can be configured to cause the fabrication module to form a first mask on the first polysilicon layer and to dispose a second polysilicon layer such that the second polysilicon layer covers the first mask. The controller may cause the fabrication module to form a second mask on the second polysilicon layer. Additionally, the controller may cause the fabrication module to remove portions of the first and second polysilicon layers that are uncovered by either of the first and second masks.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only Additional embodiments will be apparent to a person skilled in the relevant art(s) based on the teachings contained herein.

BRIEF DESCRIPTION OF THE DRAWINGS/FIGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

Figure 1:
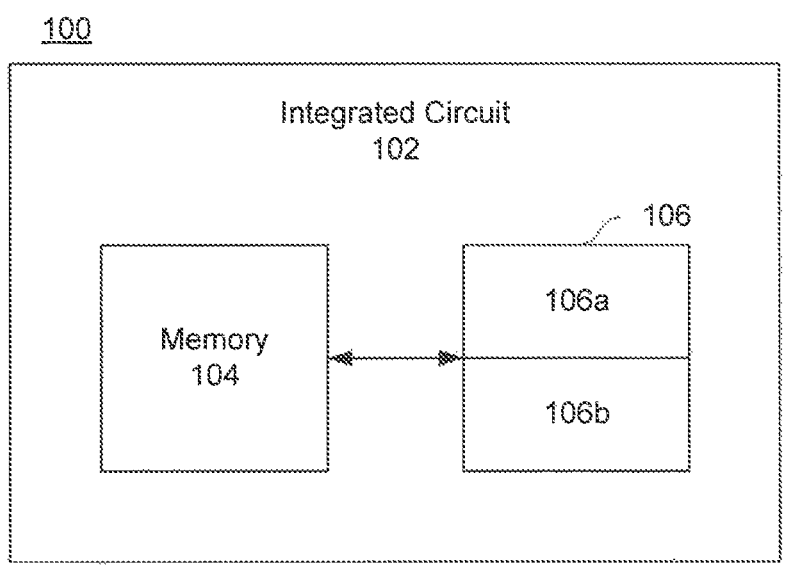
FIG. 1 is a functional block diagram depicting an embedded memory device according to embodiments of the invention.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION OF THE INVENTION

The following detailed description refers to the accompanying drawings that illustrate exemplary embodiments consistent with this invention. Other embodiments are possible, and modifications can be made to the embodiments within the spirit and scope of the invention. Therefore, the detailed description is not meant to limit the invention. Rather, the scope of the invention is defined by the appended claims.

FIG. 1 is a functional block diagram that depicts an embedded semiconductor device 100 according to various embodiments of the invention. As can be seen, the semiconductor device 100 is embodied as a single integrated circuit 102 that contains a memory unit 104 and a logic unit 106. The logic unit 106 may further comprise several different kinds of logic. For instance, according to some embodiments, the logic unit 106 may include a high voltage logic 106a and low voltage logic 106b. Semiconductor device 100 could be a Flash memory according to some embodiments. In some instances, the memory unit 104 and the logic unit 106 may require slightly different and incompatible manufacturing processes.

For instance, the memory unit 104 may contain a number of wordlines (WL) that need to be spaced very closely together (e.g., closer together than the resolution limit of lithography) and, therefore, require the use of spacer to grow the wordlines to the correct dimensions. By contrast, the logic gates in the logic unit 106 are typically relatively thinner, narrower, and farther apart than the WLs of the memory unit 104. Accordingly, the spacer Technique used to form the WLs is unsuitable for forming logic gates in the logic unit 106 and vice versa. While the embedded semiconductor device 100 has been described as with respect to an IC 102 that contains a memory unit 104 and a logic unit 106, this is used merely as an illustrative example. A person of ordinary skill in the art would understand that aspects of the present invention are applicable to any embedded semiconductor device 100 that contains elements with incompatible manufacturing processes, and are not just limited to the example integrated circuit 102 depicted in FIG. 1.

Figure 2A:
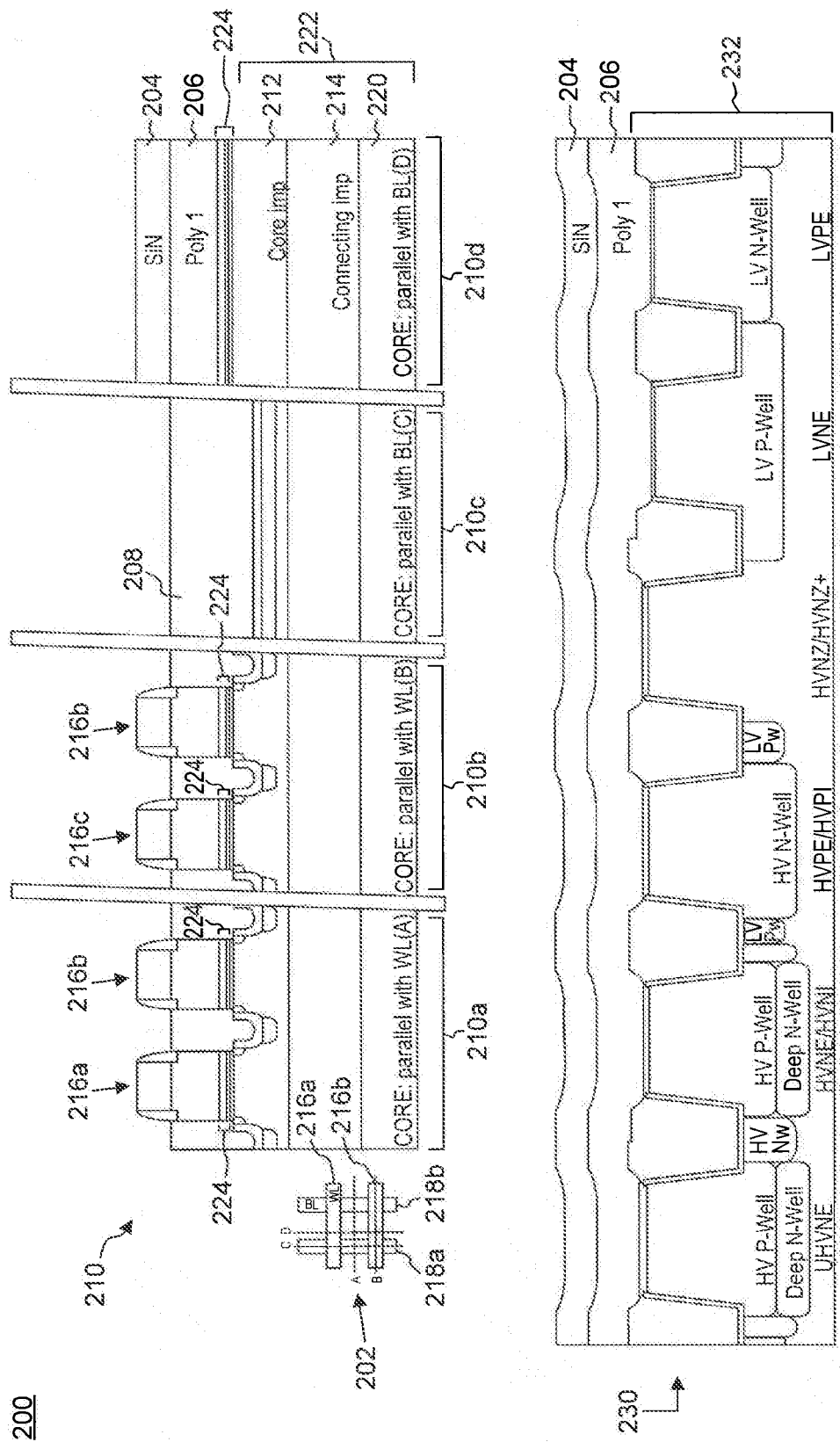
FIGS. 2a-2h are depictions of a semiconductor device at various stages of manufacture according to embodiments of the invention.

FIGS. 2a-2h depict an exemplary semiconductor device 200 at various points in a manufacturing process that addresses the problems associated with the inherent incompatibility of the processes required for producing different kinds of elements (e.g., memory and logic) on the same integrated circuit according to embodiments of the invention. As shown in FIG. 2a, the semiconductor device 200 is depicted in cross section at the core 210 and at the periphery 230. The core 210 portion of the semiconductor device 200 is depicted at four different locations relative to the various writelines 216a and 216b (collectively referred to herein as writelines 216) and bitlines 218a and 218b (collectively referred to herein as bitlines 218). 210a depicts a cross section of the core viewed from a direction parallel with line A in key 202, 210b depicts across section of the core viewed from a direction that is parallel with line B in key 202, 210c depicts a cross section of the core viewed from a direction that is parallel with line C in key 202, and 210d depicts a cross section of the core viewed from a direction that is parallel with line D in the key 202.

Each of the core 210 and the periphery 230 has specific structures unique to that portion of the device 200. For instance, the core contains a number of core-specific layers 220. The core-specific layers may include, for instance a layer where the core circuitry is implemented 212, a connecting layer, 214, and a substrate 220. Similarly, the periphery may contain a layer of logic circuitry 232 that is specific to the periphery 230. The logic circuit 232 may comprise, for instance, a number N-wells and P-wells, and other necessary components for forming the logical circuitry. As shown in FIG. 2a, both the core 210 and the periphery 230 share a common first layer of polysilicon (poly1) 206 and a nitride layer 204. As shown in FIG. 2a, portions of the poly1 layer 206 have been removed (e.g., etched) from the core region. An oxide 208 has been filled in where the poly1 206 has been etched in the core 210.

Figure 2B:
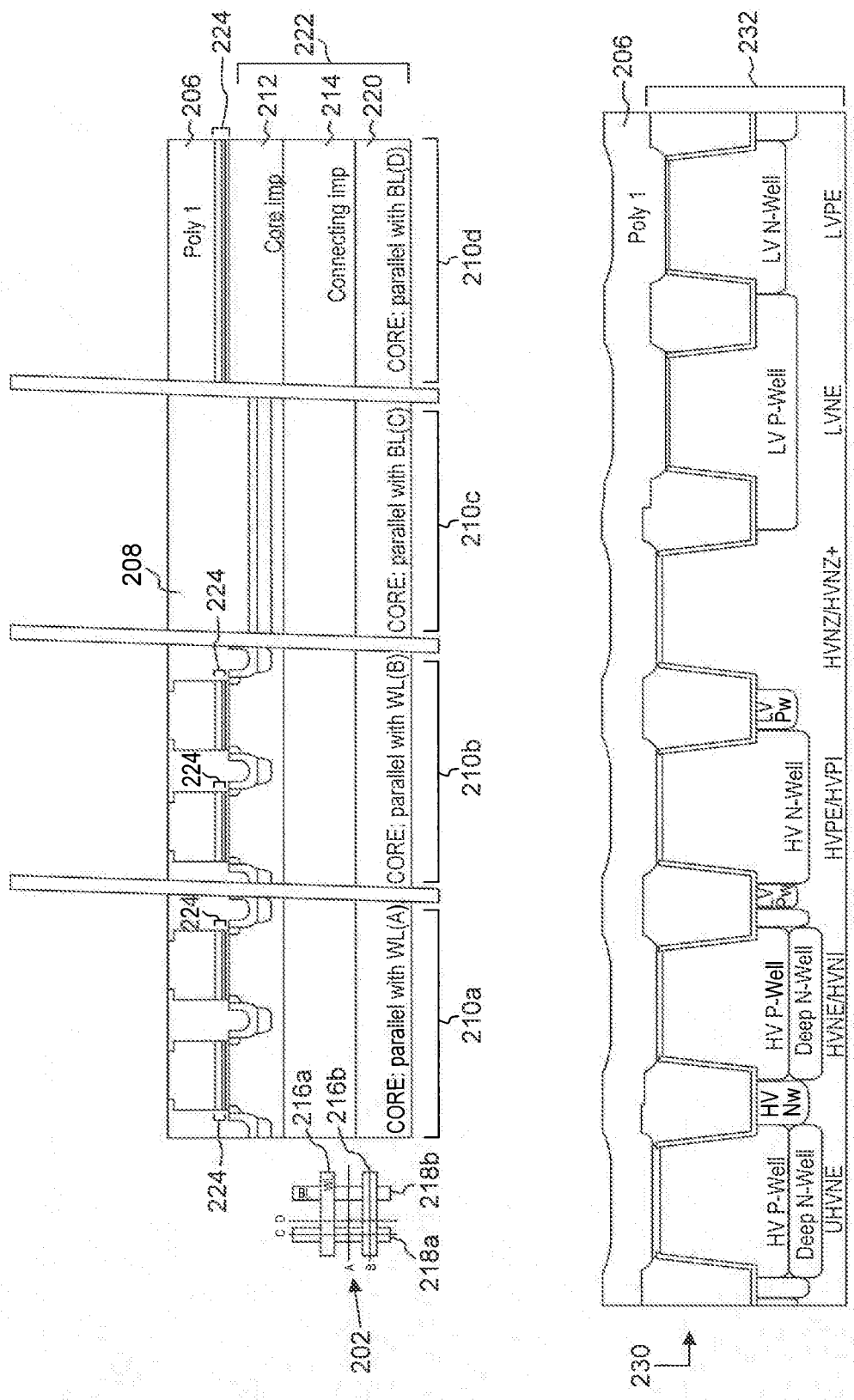
Figure 2C:
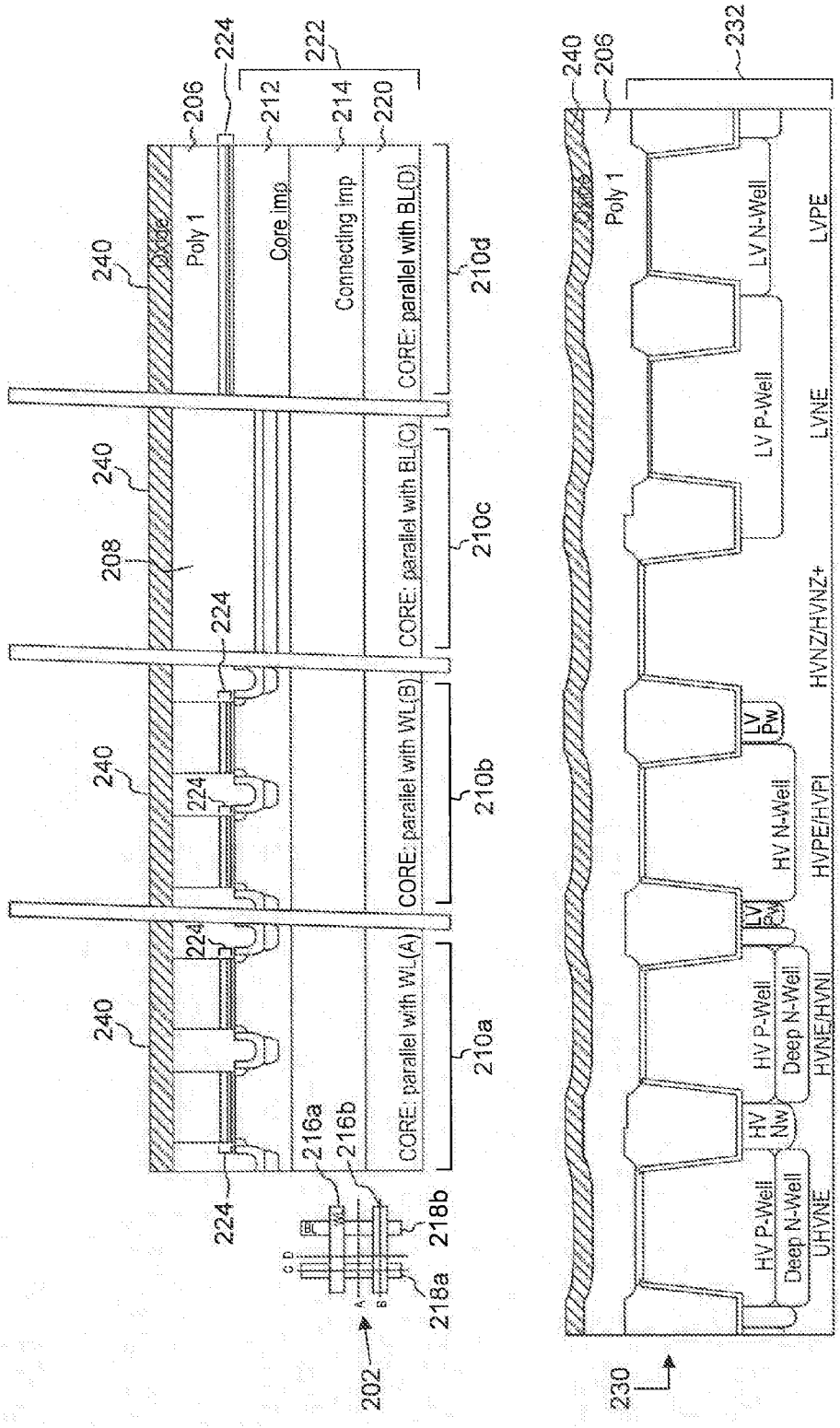

FIG. 2b depicts the semiconductor device 200 after the nitride layer 204 has been removed from the core 210 and the periphery 230. According to some prior methods of manufacturing embedded semiconductor devices such as Flash memory, a second poly layer would be deposited and the core and periphery would be patterned using the spacer approach discussed above. Instead, in embodiments, an insulator 240 is deposited over the core 210 and periphery 230 portions of device 200, as shown in FIG. 2c. The Example depicted in FIG. 2c illustrates the insulator 240 as an oxide, but any other suitable dielectric could be used. For instance, according to various embodiments, the dielectric may comprise a nitride layer or a combination of dielectrics (e.g., a combination of nitride and oxide). The dielectric layer 240 will be used to form a buried mask according to embodiments of the invention.

According to some embodiments, the dielectric layer 240 may be disposed on the poly1 layer 206 using any well-known method such as deposition. Deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

Additionally according to some embodiments, the dielectric layer 240 can be out of a native oxide of Si or Al by light oxidation of the surface of the poly1 layer 206 using oxidation species generated in plasma, a radical environment, or ozone. Any of these methods may be used according to various embodiments.

Figure 2D:
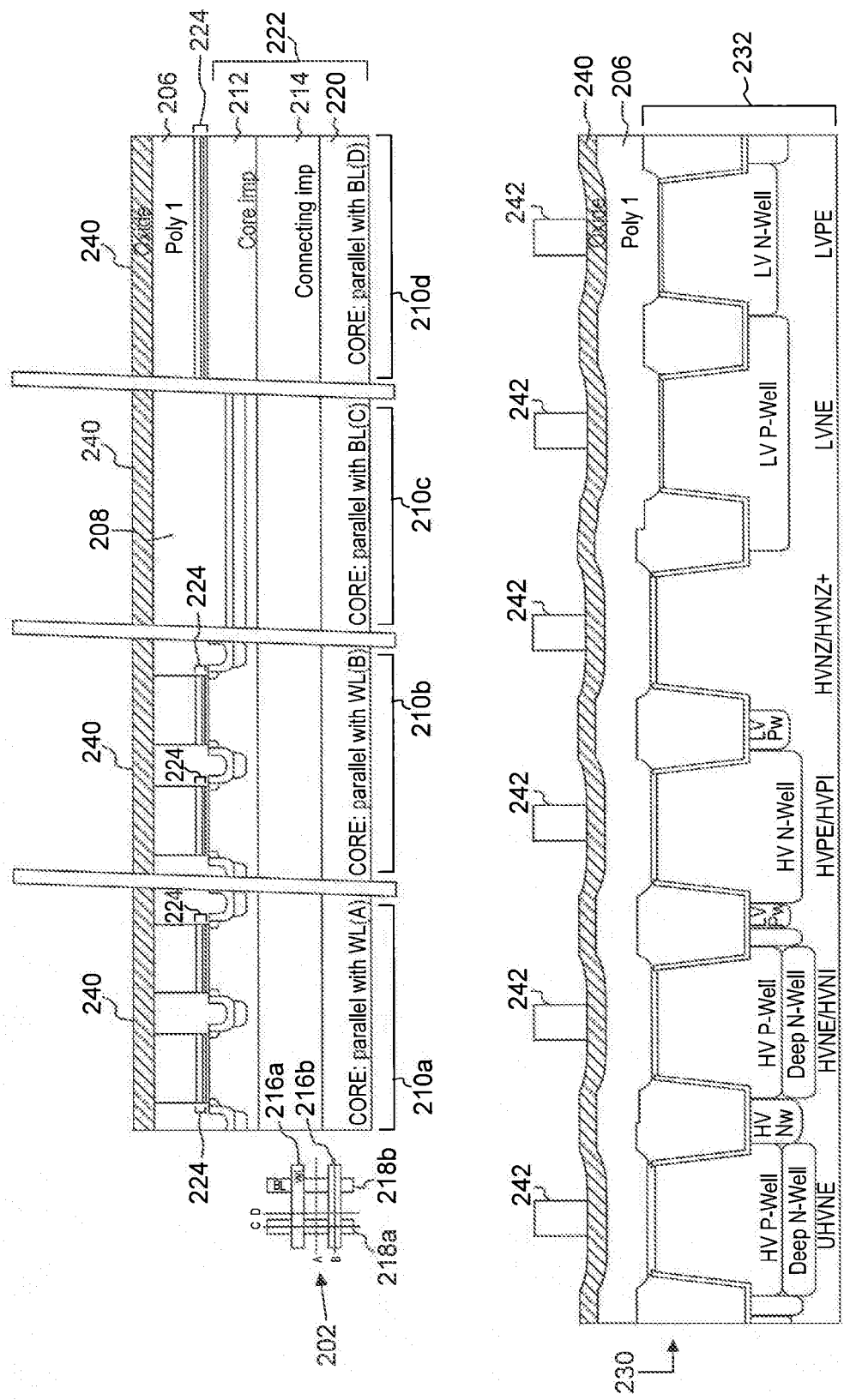

FIG. 2d depicts the device 200 after masking structures 242 have been formed over a portion of the dielectric 240. As depicted herein, the masking structures 242 are only formed in the periphery, but it would be within the scope of embodiments of the invention to also form structures 242 in the core, if so required. Additionally, the masking structures 242 may comprise any appropriate material that allows for selective removal (e.g., etching) of the dielectric layer 240—i.e., the removal of the dielectric layer without the removal of the structure 242. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Figure 2E:
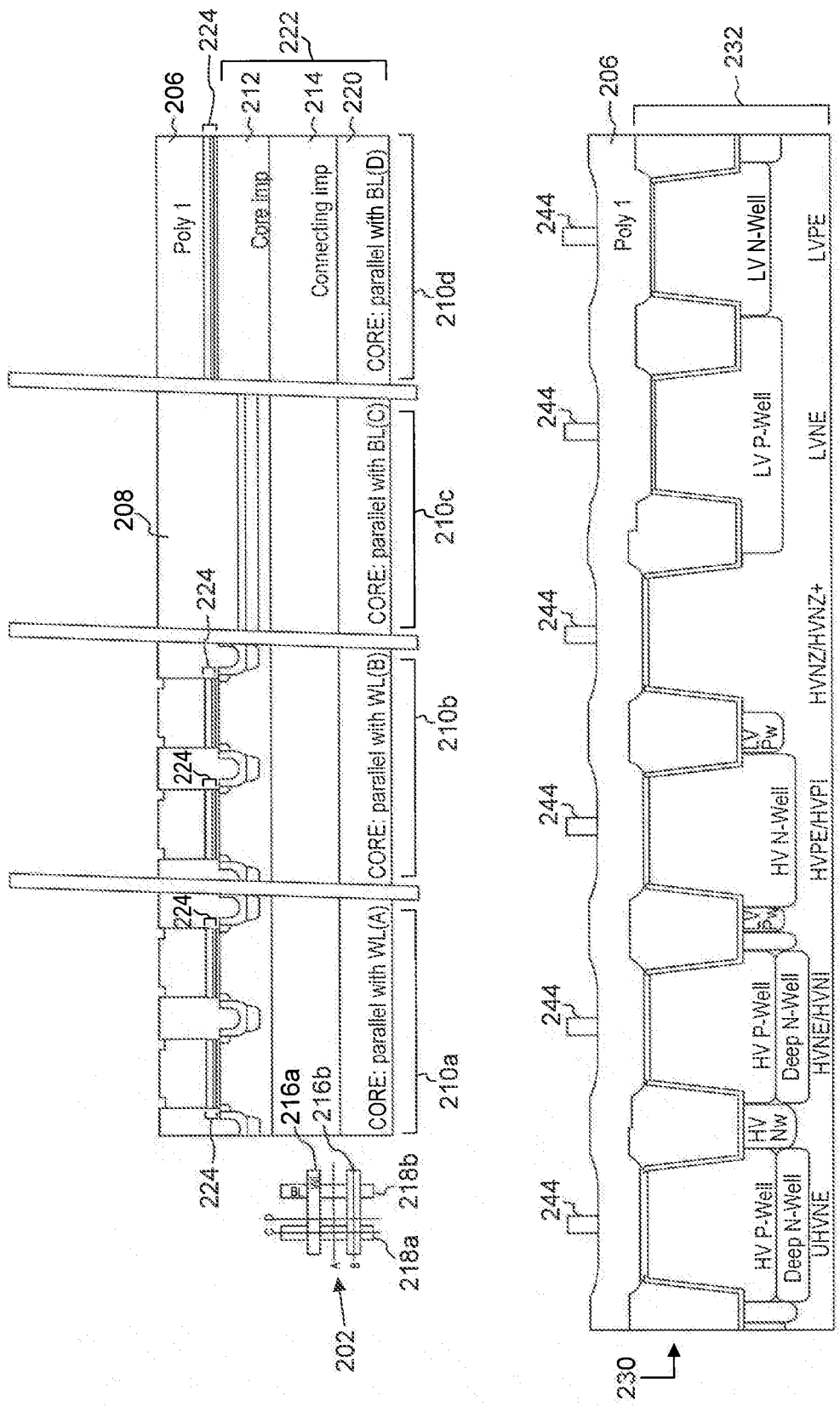

FIG. 2e depicts the device 200 after the dielectric layer 240 has been removed in the places left uncovered by the masking structures 242. Additionally, the masking structures 242 have been removed. The remaining portions of the dielectric layer 240 form a first mask 244 covering the poly1 layer 206. According to various embodiments, the removed portion of the dielectric layer 240 is removed using well-known etching methods. For instance, the dielectric layer may be etched using Cl2, KOH, TMAH (tetra-methyl-amino-hydroxyl), or using gas phase etching with, for instance, H2, HCl, O2, H2O (vapor or gas), O3, HF, F2, and Carbon-Fluoride compounds with Cl2 and XeF2. Additionally, according to some embodiments, a combination of etching products may be used.

Figure 2F:
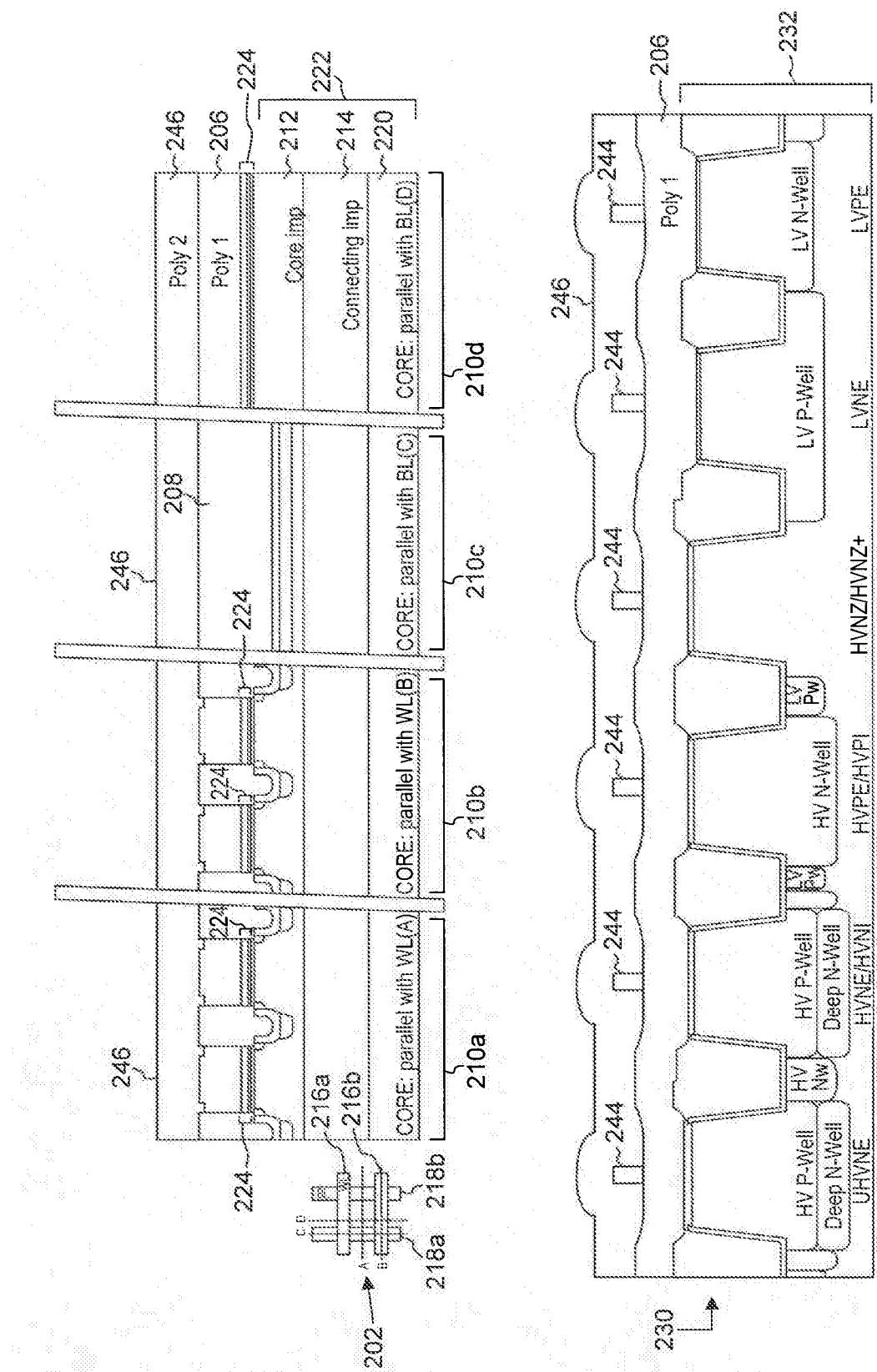

FIG. 2f depicts the device 200 after a second polysilicon layer (poly2) 246 has been disposed on both the core 210 and the periphery of the device 200. As shown, the poly2 246 layer entirely covers and/or buries the first mask 244. According to various embodiments, the poly2 layer 246 may be disposed over the device 200 by deposition. As noted above, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), etc. Additionally, prior to deposition of the poly2 layer 246, a pre-deposition clean may be used to minimize dielectric attack.

Figure 2G:
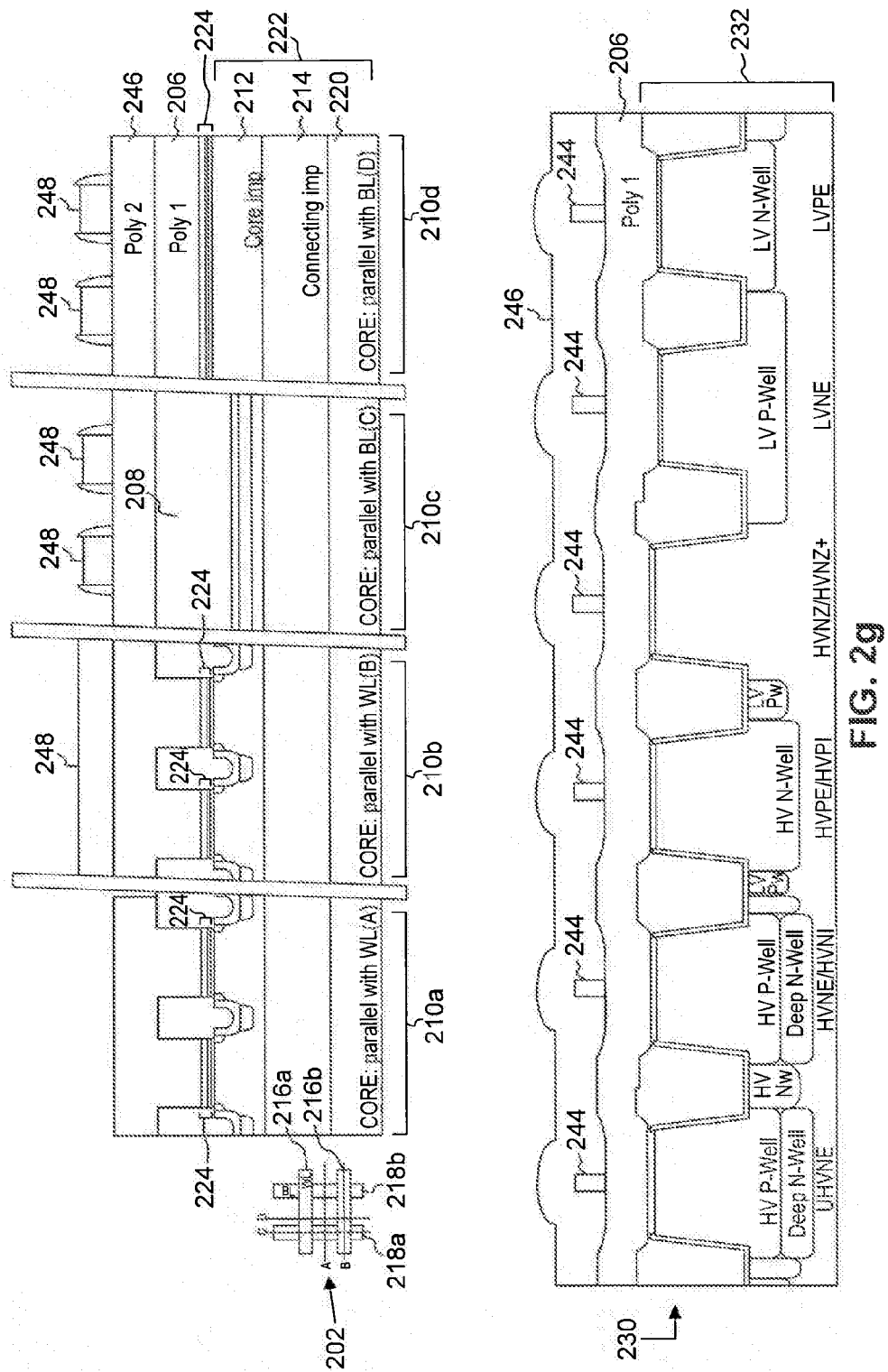

FIG. 2g depicts the device 200 after a second mask 248 has been formed on top of the poly2 layer 246. According to various embodiments, the second mask 248 may be formed similarly to the way the first mask 244 was formed. That is, the second mask may be formed by disposing a second dielectric layer over the poly2 layer 246, forming masking structures over the dielectric out of, e.g., photoresist, and removing the portions of the second dielectric layer left uncovered by the masking structures. The photoresist can also be removed leaving only the second mask 248. While FIG. 2g depicts the second mask 248 as only being formed on the core 210 of device 200, it is well within the scope of embodiments of the invention to have parts of the second mask formed on the periphery or to have the second mask formed entirely on the periphery.

Figure 2H:
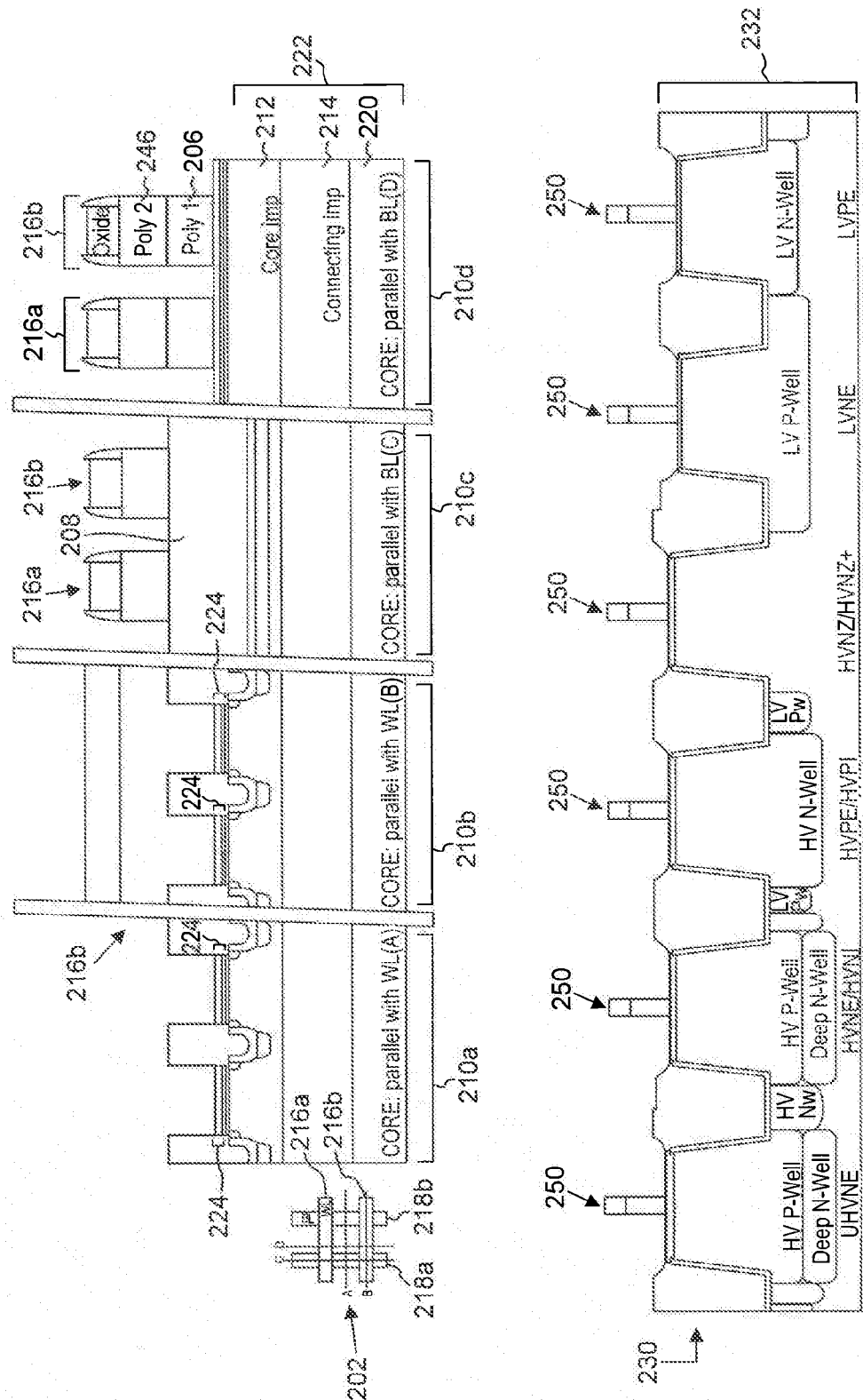

FIG. 2h depicts device 200 after the poly1 206 and poly2 246 layers have been removed in the areas that are covered by neither of the first mask 244 or the second mask 248. According to embodiments of the invention, the polysilicon layers 244 and 248 can be removed (e.g., etched) simultaneously from the core 210 and the periphery 230. Once the portions polysilicon layers 244 and 248 are removed, the core 210 is left with wordline structures 216a and 216b that have the correct dimensions and spacing. Additionally, the periphery 230 is left with logical gate structures 250 having the correct dimensions and spacing.

Thus, as can be seen, the manufacturing process steps depicted in FIGS. 2a-2h allow the production of an embedded semiconductor device having components that require different process steps with minimal change to the baseline process flow for either of the components. Specifically, by insterting the formation of the first mask 244 and burying it in the second polysilicon layer poly2 248, logic gates 250 can be produced during the same patterning as the wordlines 216.

The example of the semiconductor device 200 depicted in FIGS. 2a-2h is but one of many possible devices that can be produced according to embodiments of the present invention. For instance, FIGS. 2a-2h depict the logical circuitry 232 as exclusively the domain of the periphery 230, and the memory components (e.g., wordlines 216 and bitlines 218) as exclusively located in the core. This, however, need not be the case. For instance, according to some embodiments, the periphery may contain some memory components and the core may contain some logical circuitry. Additionally, the device 200 need not be divided into a core 210 and a periphery 230 that are physically separated from each other. Instead, according to some embodiments, the memory elements and the logical device elements may be interspersed with each other throughout the semiconductor device.

Figure 3:
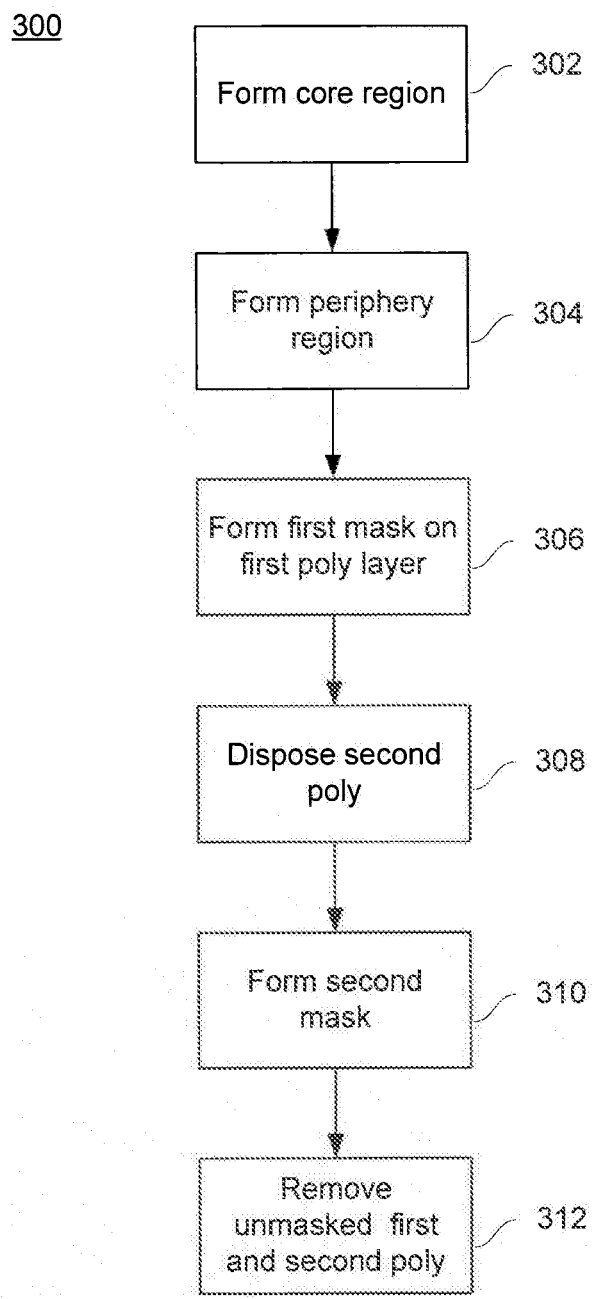
FIG. 3 is a flowchart depicting a method of manufacturing an embedded semiconductor device according to embodiments of the invention.

FIG. 3 depicts a method 300 of producing a semiconducting device according to embodiments of the present invention and is described for illustrative purposes with reference to FIGS. 2a-2h. According to the method 300, a core region 210 of the device 200 is formed at step 302. The core region may contain, for instance, structures 220 that are particular to the function of the core region, as described above.

At step 304 the periphery 230 region can be formed. Similarly to the core region, the periphery may contain, for instance, structures 232 that are particular to the function of logical devices. According to various embodiments, steps 302 and 304 may be performed in any order—i.e., step 304 may be performed before step 302 according to some embodiments, or steps 302 and 304 may be performed simultaneously.

At step 306, a first mask layer 244 is formed on a first polysilicon layer 206, which may be disposed on both the core 210 and the periphery 230. The first mask layer 244 may be formed by disposing a dielectric layer 240 such as an oxide, nitride, or combination of oxide and nitride, over the device 200 and then forming masking structures using, for example, photoresist 242 on top of the dielectric layer 240. As described above, the dielectric layer may be disposed using any of a number of well-known deposition techniques according to various embodiments. The dielectric layer 240 can then be etched in the areas not masked by the photoresist 242 and the photoresist 242 can be removed, thereby forming mask layer 244.

At step 308, a second polysilicon layer 246 can be formed over the first mask layer 244. The second polysilicon layer 246 can entirely cover and/or bury the first mask layer 244. The second polysilicon layer 246 may be formed by deposition according to any of a number of well-known and suitable methods such as those described above.

At step 310 a second mask 248 can be formed on, top of the second polysilicon layer 246. According to embodiments, the second mask 248 may be formed in a similar manner to the first mask 244. Namely, a layer of dielectric may be deposited over the second polysilicon layer 246 and a number of mask elements may be formed using e.g., photoresist. Once the mask elements are formed, the dielectric that remains uncovered by the mask elements may be removed (e.g., etched according to any of a number of well-known methods) and the mask elements removed leaving only the second mask 248 disposed on top of the second polysilicon layer 248.

At step 312, the portions of the first polysilicon layer 206 and the second polysilicon layer 246 that are uncovered by either of the first mask 244 or the second mask 248 can be removed by any of a number of well-known techniques. For instance, they could be etched as described above. According to various embodiments, the polysilicon layers 244 and 248 may be removed from the core 210 and the periphery 230 simultaneously.

Figure 4:
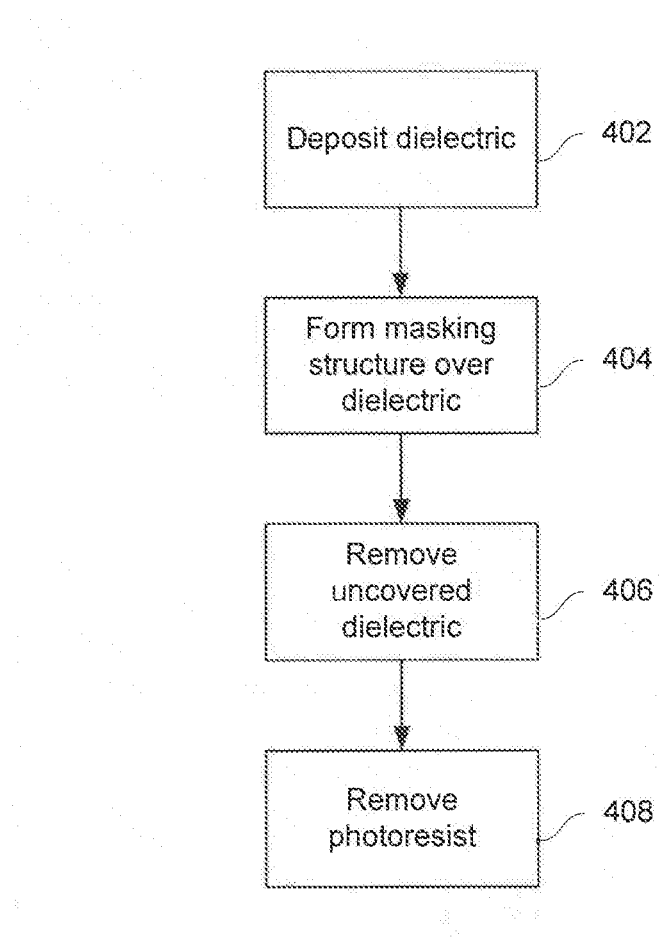
FIG. 4 is a flowchart depicting a method of manufacturing an embedded semiconductor device according to embodiments of the invention.

FIG. 4 depicts a method 400 of forming a mask (e.g., first mask 244 or second mask 248) according to embodiments of the present invention. Method 400 will be described with reference to FIGS. 2a-2h, but should not be interpreted to be limited to the embodiments depicted therein. At step 402, a dielectric material 240 is deposited over the layer that is to be masked by the mask. For instance, as shown in FIGS. 2a-2h, mask 244 masks poly1 206 and mask 248 masks poly2 246. Accordingly, to form masks 244 and 248, dielectric layers are deposited on the poly1 206 and poly2 246 layers, respectively. The dielectric layer may comprise any suitable dielectric including oxides, nitrides, or a combination of oxides and nitrides.

At step 404, a masking structure 242 is formed over the dielectric 240 in the places where the mask will be located. According to various embodiments, the masking structure 242 may comprise a positive or negative photoresist. However, the masking structure may comprise any material that withstand the processing of removing the dielectric layer (e.g., etching).

At step 406, the portions of the dielectric layer 240 that are left uncovered by the masking structure 242 are removed using any of a number of well-known methods. For instance, the dielectric layer 240 can be etched by wet, dry, or plasma etching techniques according to various embodiments.

At step 408, the masking structure 242 is removed thereby leaving only the mask 244 disposed over the layer to be masked (e.g., poly1 206).

Figure 5:
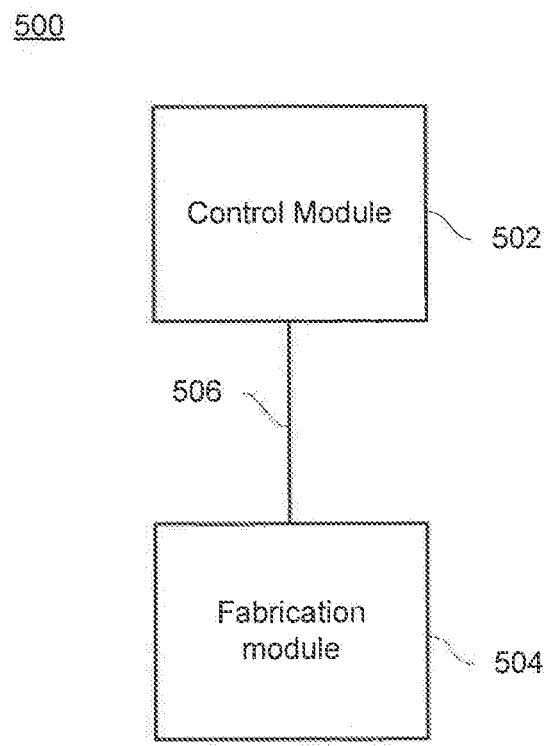
FIG. 5 is a functional block diagram depicting an apparatus for producing an embedded memory device according to embodiments of the invention.

FIG. 5 is a functional block diagram of an apparatus 500 for producing a semiconducting device such integrated circuit 102 according to various embodiments of the invention. The apparatus includes a control module 502 connected to a fabrication module 504 by a communication link 506. According to various embodiments, the control module 502 may comprise any well-known general purpose computer containing a memory that stores computer instructions and a processor for executing the computer instructions.

The fabrication module 504 can include semiconductor fabrication equipment of any number of well-known types. The control module 502 can contain computer instructions, that when executed, cause control signals to be sent to the fabrication module 504 via the communication link 506. The control signals can cause the fabrication module 404 to produce a semiconducting device according to method 300 depicted in FIG. 3 and as shown in FIGS. 2a-2h, and/or according to method 400, according to embodiments. For instance, the signals could be configured to cause the fabrication module 504 to form a semiconductor device by forming a core region 210 and a periphery region 230. The fabrication module 504 may then be instructed to form a first mask 244 on a first polysilicon layer 206 that is disposed on both of the core 210 and the periphery 230. A second polysilicon layer 246 may then be disposed on top of the first mask 244 such that the first mask 244 is entirely covered by the second polysilicon layer 246. Next, a second mask 248 may be formed on the second polysilicon layer 246. Finally, the control module 502 may be configured to instruct the fabrication module 504 to remove the unmasked portions of the first and second polysilicon layers 206 and 246 simultaneously from the core 210 and the periphery 230 of the semiconductor device 200.

According to embodiments, the control module 502 may be implemented as a any number of well known computers, such as any commercially available and well known computer capable of performing the functions described herein, such as computers available from International Business Machines, Apple, Sun, HP, Dell, Compaq, Digital, Cray, etc.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of manufacturing an embedded semiconductor device, comprising:
    forming a core region of the semiconductor device, wherein the core region is configured to contain one or more memory devices;
    forming a periphery region of the semiconductor device, wherein the periphery region is configured to contain logical gates to control the one or more memory devices;
    disposing a first polysilicon layer over the core and periphery regions of the semiconductor device;
    forming a first mask on the first polysilicon layer;
    disposing a second polysilicon layer such that the second polysilicon layer covers the first mask;
    forming a second mask on the second polysilicon layer in the core region without forming the second mask in the periphery region; and
    removing portions of the first and second polysilicon layers that are uncovered by either of the first and second masks.

2. The method of claim 1, wherein the first mask is disposed on the periphery region of the semiconductor device.

3. The method of claim 2, further comprising forming logic gates from a portion of the periphery region that is masked by the first mask.

4. The method of claim 1, wherein the second mask is disposed on the core portion of the semiconductor device.

5. The method of claim 4, further comprising forming bitlines or writelines from a portion of the core region that is masked by the second mask.

6. The method of claim 1, wherein the first and second masks comprise oxides, nitrides, or an oxide/nitride combination.

7. The method of claim 1, wherein the first and second masks comprise the same material.

8. The method of claim 1, further comprising forming one or more memory elements in the core region of the semiconductor.

9. The method of claim 1, further comprising forming one or more logical devices in the periphery region of the semiconductor.

10. The method of claim 1, wherein the removed portions of the first and second polysilicon layers are removed from the core and periphery regions simultaneously.

11. An apparatus, comprising:
    a semiconductor fabrication module; and
    a controller configured to cause the semiconducting fabrication module to:
        form a core region of a semiconductor device, wherein the core region is configured to contain one or more memory devices;
        form a periphery region of the semiconductor device wherein the periphery region is configured to contain logical gates to control the one or more memory devices;
        dispose a first polysilicon layer over the core and periphery regions of the semiconductor device;
        form a first mask on the first polysilicon layer;

dispose a second polysilicon layer such that the second polysilicon layer covers the first mask;

form a second mask on the second polysilicon layer in the core region without forming the second mask in the periphery region; and remove portions of the first and second polysilicon layers that are uncovered by either of the first and second masks.

12. The apparatus of claim 11, wherein the controller is further configured to cause the fabrication module to dispose the first mask on the periphery region of the semiconductor device.

13. The apparatus of claim 12, wherein the controller is further configured to cause the fabrication module to form logic gates from a portion of the periphery region that is masked by the first mask.

14. The apparatus of claim 11, wherein the controller is further configured to cause the fabrication module to dispose the second mask on the core portion of the semiconductor device.

15. The apparatus of claim 14, wherein the controller is further configured to cause the fabrication module to form bitlines or writelines from a portion of the core region that is masked by the second mask.

16. The apparatus of claim 11, wherein the first and second masks comprise oxides, nitrides, or an oxide/nitride combination.

17. The apparatus of claim 11, wherein the first and second masks comprise the same material.

18. The apparatus of claim 11, wherein the controller is further configured to cause the fabrication module to form one or more memory elements in the core region of the semiconductor.

19. The apparatus of claim 11, wherein the controller is further configured to cause the fabrication module to form one or more logical devices in the periphery region of the semiconductor.

20. The apparatus of claim 11, wherein the controller is further configured to cause the fabrication module to remove the removed portions of the first and second polysilicon layers from the core and periphery regions simultaneously.

* * * * *